(12) United States Patent
Lin

(10) Patent No.: US 6,524,524 B1
(45) Date of Patent: Feb. 25, 2003

(54) METHOD FOR MAKING A HEAT DISSIPATING TUBE

(75) Inventor: Yu-Shen Lin, Taipei Hsien (TW)

(73) Assignee: Auras Technology Ltd., Taipei Hsien (TW)

( * ) Notice: Subject to any disclaimer, the term of this patent is extended or adjusted under 35 U.S.C. 154(b) by 0 days.

(21) Appl. No.: 09/976,713

(22) Filed: Oct. 12, 2001

(51) Int. Cl.$^7$ .................................................. B22F 3/11
(52) U.S. Cl. ............................................................ 419/9
(58) Field of Search ......................................... 419/2, 9

(56) References Cited

U.S. PATENT DOCUMENTS

| | | | | |
|---|---|---|---|---|
| 3,762,011 A | * | 10/1973 | Staudhammer et al. | 165/104.26 |
| 3,899,325 A | * | 8/1975 | Harrison | 419/2 |
| 5,943,543 A | * | 8/1999 | Uchida et al. | 264/497 |

FOREIGN PATENT DOCUMENTS

| | | | | |
|---|---|---|---|---|
| SU | 1495627 | * | 7/1989 | |
| SU | 1518647 | * | 10/1989 | |

* cited by examiner

*Primary Examiner*—Ngoclan Mai
(74) *Attorney, Agent, or Firm*—Dellett & Walters

(57) ABSTRACT

A method for making a heat dissipating tube includes the steps of preparing a copper plate, forming a cylindrical tube with a flat bottom and an open end, inserting a copper bar and copper powder into the cylindrical tube, sintering the copper powder to form porous pyrocrystalline copper, removing the copper bar and thus defining a central hole in the porous pyrocrystalline copper, attaching a cap with an drain hole to the open end to close the open end, filling the cylindrical tube with a heat conducting fluid through the drain hole, and drawing a vacuum inside the cylindrical tube through the drain hole and then sealing the drain hole.

3 Claims, 6 Drawing Sheets

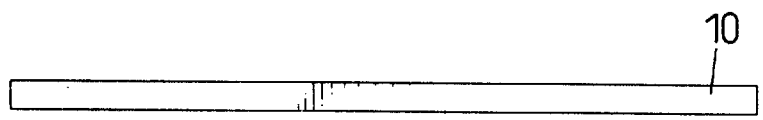
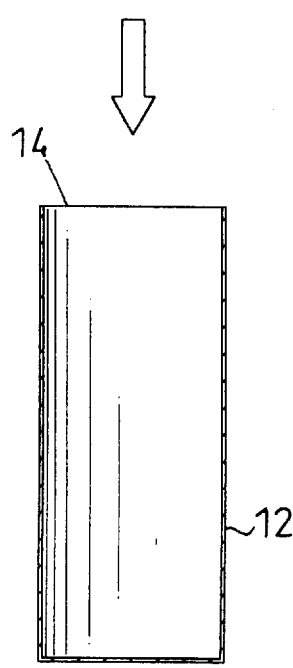
FIG.1A
FIG.1B
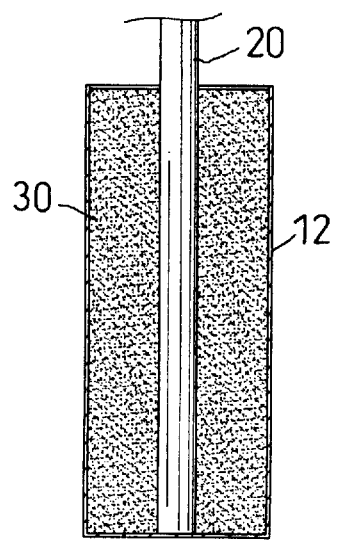
FIG.1C

METHOD FOR MAKING A HEAT DISSIPATING TUBE

BACKGROUND OF THE INVENTION

1. Field of the Invention

The present invention relates to a method for making a cylindrical heat dissipating tube, and more particularly to a method for making a heat dissipating tube for use with an integrated circuit board.

2. Description of Related Art

Because the operating speed of integrated circuits has constantly increased, large integrated circuits have been developed. Moreover, to reduce fabrication cost, the integrated circuits are small in size and a lot of peripherals are integrated to form an even more compact package, such as SOC (System On A Chip) or SOAC (System On An Application Chip). However, large integrated circuits force electronic manufacturers to deal with the heat generated during the operation of the integrated circuit and the associated problems. Tests have shown that the operation of an integrated circuit is adversely affected when the temperature of the integrated circuit reaches 70° C. Therefore, electronic manufacturers have been forced to solve the heat problem. To maintain the high speed operation of integrated circuits without interference from heat, heat sinks were introduced to electronic design to lessen the problem. Heat sinks do have the ability to ease the heat problem. However, in practice, the intense heat is created only when the integrated circuit is in operation and is generated within a very short period of time. Therefore, heat sinks are only marginally effective in dissipating such a large amount of heat.

To enhance the heat dissipation, a cylindrical heat dissipating tube is incorporated with the heat sink so that a large amount of heat can be dissipated quickly.

With reference to FIGS. 5 and 6, a fan (94) and a conventional metallic cylindrical heat dissipating tube (90) are mounted on a substrate (92) so that the substrate (92) is able to be mounted on top of an integrated circuit (not shown) to instantly dissipate heat. A heat sink (96) with a channel (not numbered) defined to fit around the conventional heat dissipating tube (90) may be used to increase the heat dissipation capability of the conventional heat dissipating tube (90). The heat dissipating tube (90) is comprised of a cylinder (900) that has two ends that are normally closed by melting and pulling the tube, which forms pointed ends (not shown). A heat dissipating tube (90) with two pointed ends is not suitable for engaging with the substrate (92) to have the desired heat dissipation effect. To obviate the foregoing drawback, the heat dissipating tube (90) is first made of a hollow cylinder (900) with two open ends, and a cap (902) is then soldered in one open end to close the end of the cylinder (900). After one open end is closed, the cylinder (900) is filled with a fluid as a heat conducting medium. Then, another cap (902) is soldered in the other end to close the cylinder (900). However, during the soldering process, a solder line (904) is formed at the joint between the cylinder (900) and the cap (902). The solder line (904) is an obstacle to the transfer of heat to the fluid inside the heat dissipating tube (90). Furthermore, because the fluid is inside the heat dissipating tube (90) and functions as a heat conducting medium, the heat absorbed by the fluid may not conduct and dissipate evenly to the environment. For example, a situation is likely to occur where the temperature at the bottom of the heat dissipating tube (90) is higher than the temperature at the top of the heat dissipating tube (90).

To overcome the shortcomings, the present invention provides an improved method for making a heat dissipating tube to mitigate and obviate the aforementioned problems.

SUMMARY OF THE INVENTION

The primary objective of the invention is to provide a method for making a heat dissipating tube that will reduce the cost of making the tube and increase the heat dissipation effect of the tube.

Other objects, advantages and novel features of the invention will become more apparent from the following detailed description when taken in conjunction with the accompanying drawings.

BRIEF DESCRIPTION OF THE DRAWINGS

FIG. 1A is a side plan view of a copper plate depicting the "preparing a copper plate" step of the method in accordance with the present invention;

FIG. 1B is a cross sectional side plan view of a cylindrical tube depicting the "forming a cylindrical tube with a flat bottom and an open end" step of the method in accordance with the present invention;

FIG. 1C is a side plan view in partial section of the cylindrical tube depicting the "inserting a copper bar and copper powder into the cylindrical tube" step of the method in accordance with the present invention;

DETAILED DESCRIPTION OF THE PREFERRED EMBODIMENT

Figure 2A:
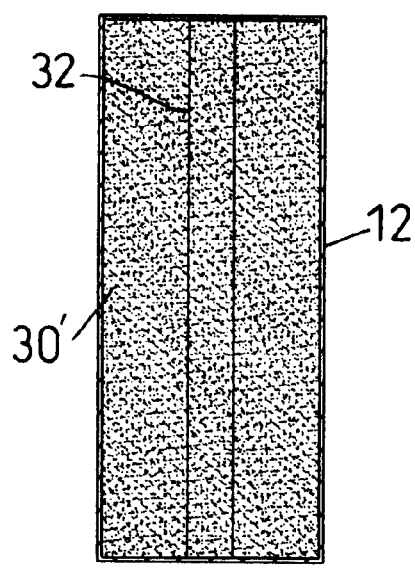
FIG. 2A is a side plan view in partial section of the cylindrical tube depicting the "sintering the copper powder" step of the method in accordance with the present invention.
Figure 2B:
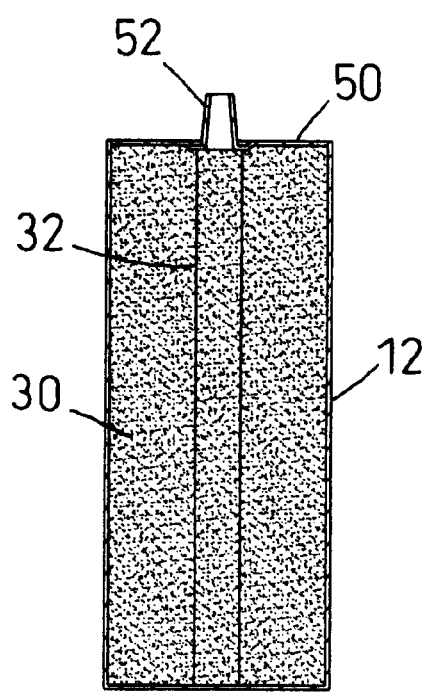
FIG. 2B is a side plan view in partial section of the cylindrical tube depicting the "removing the copper bar" step of the method in accordance with the present invention.
Figure 3A:
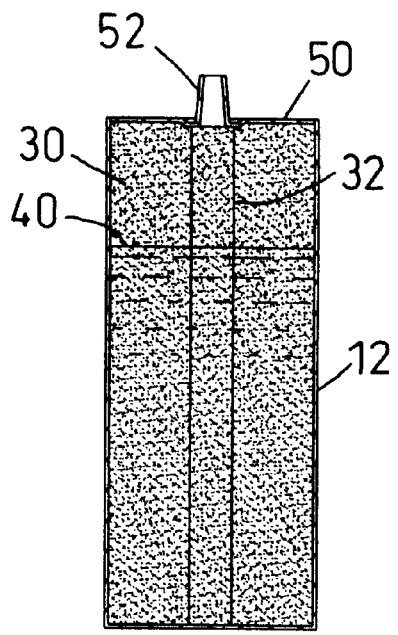
FIG. 3A is a side plan view in partial section of the cylindrical tube depicting the "attaching a cap with an drain hole to the open end" step of the method in accordance with the present invention.
Figure 3B:
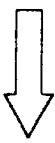
FIG. 3B is a side plan view in partial section of the cylindrical tube depicting the "filling the cylindrical tube with a heat conducting fluid" step of the method in accordance with the present invention.
Figure 3B:
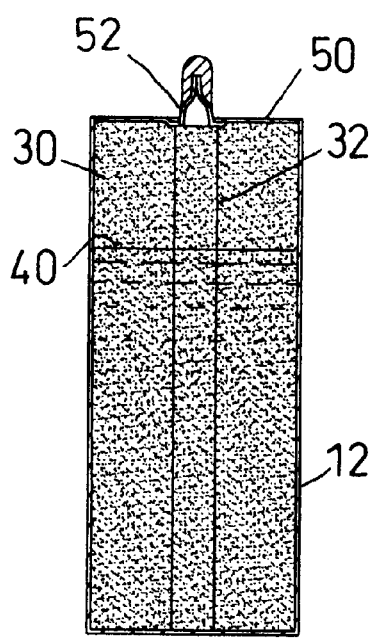

With reference to FIGS. 1A to 3B, the method for making a heat dissipating tube in accordance with the present invention comprises the steps of:

preparing a copper plate (10);

forming a cylindrical tube (12) with a flat bottom and an open end (14);

inserting a copper bar (20) and copper powder (30) into the cylindrical tube (12);

sintering the copper powder (30) around the copper bar (20) so that the agglomerated copper power (30) acts as a heat conductor, wherein the temperature for sintering is approximately 1000° C. and the agglomerated copper powder (30) is thus formed into porous pyrocrystalline copper (30');

removing the copper bar (20) and thus defining a central hole (32) in the porous pyrocrystalline copper (30');

attaching a cap (50) with an drain hole (52) to the open end (14) to close the open end (14), wherein the method of attaching the cap (50) to the periphery defining the open end (14) may be soldering;

filling the cylindrical tube (12) with a heat conducting fluid (40) through the drain hole (52), wherein the cylindrical tube (12) is not filled completely with heat conducting fluid (40) so that a space is left for expansion and condensation when the cylindrical tube (12) undergoes heating and cooling; and drawing a vacuum inside the cylindrical tube (12) through the drain hole (52) and then sealing the drain hole (52).

Figure 4:
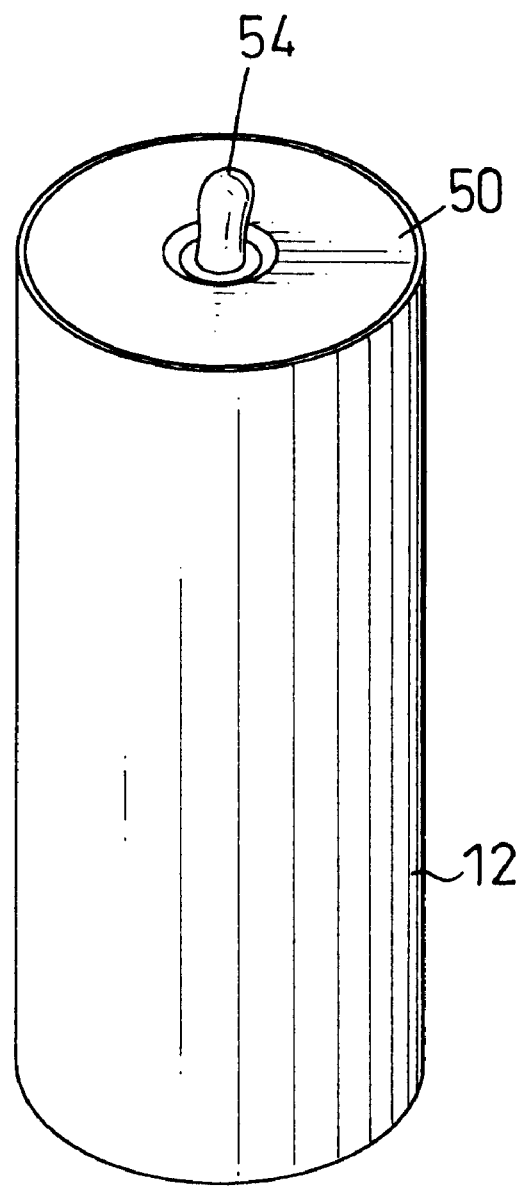
FIG. 4 is a perspective view of the heat dissipating tube fabricated using the method in accordance with the present invention.
Figure 5:
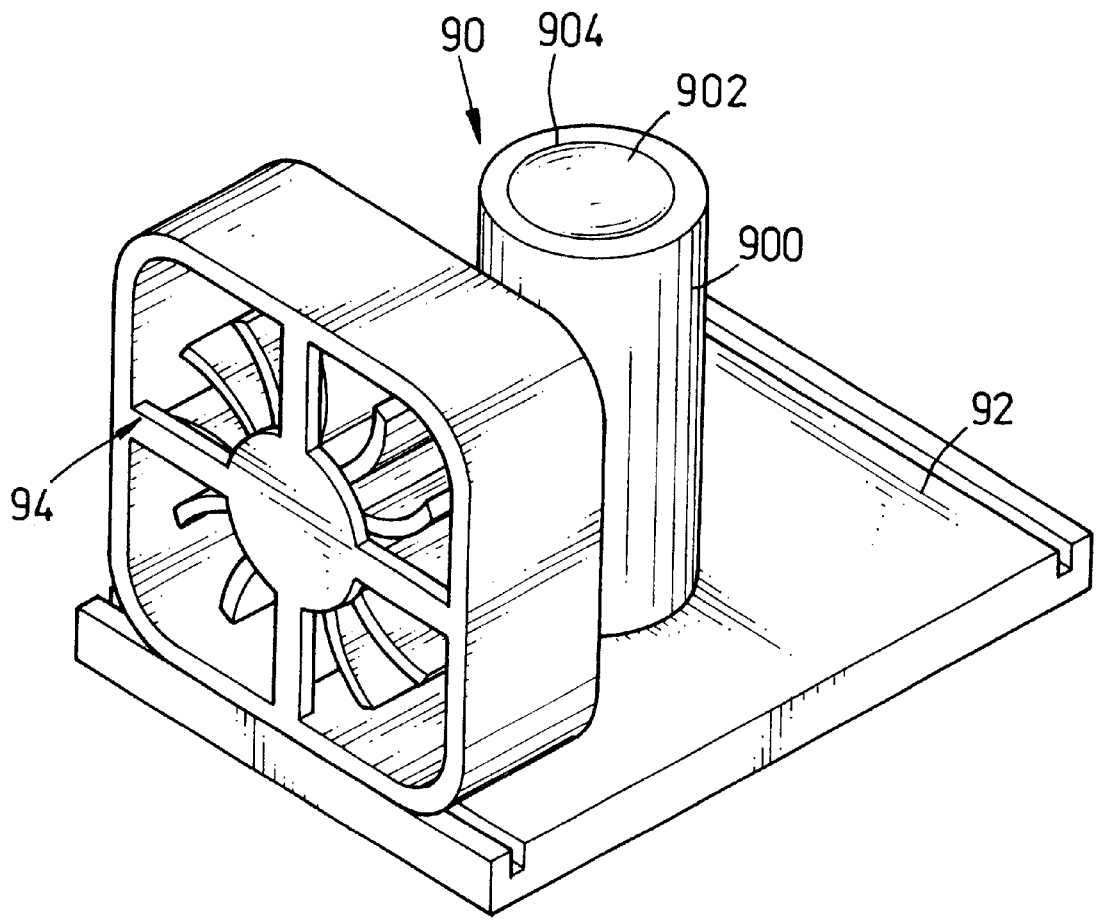
FIG. 5 is a perspective view of a conventional heat dissipating tube in combination with a fan in accordance with the prior art.
Figure 6:
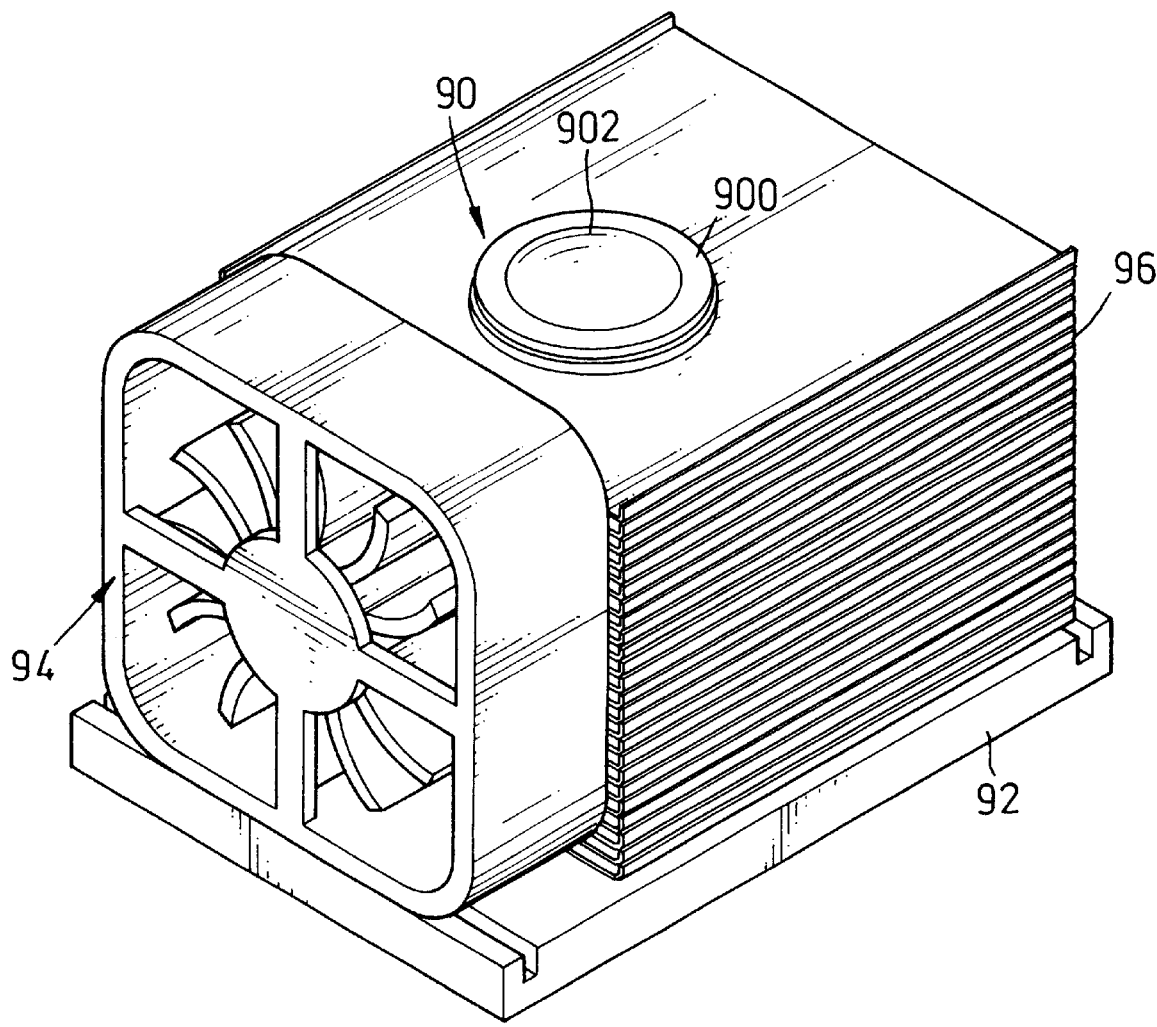
FIG. 6 is a perspective view of a conventional heat dissipating tube in combination with a heat sink.

With reference to FIG. 4, the heat dissipating tube in accordance with the present invention is one piece and has a flat and smooth bottom so that the heat dissipating tube is able to completely connect to a top of the integrated circuit and thus is able to effectively absorb the heat from the integrated circuit. The solder trace left by the soldering process is on the peripheral edge of the heat dissipating tube so that the influence on heat conductance due to the solder trace can be neglected. The porous pyrocrystalline copper (30') is able to transmit heat quickly to the heat conducting fluid (40) and the heat is stored in the heat conducting fluid (40). Furthermore, the cylindrical tube (12) is not filled completely with the heat conducting fluid (40) so that the influence on the heat dissipating tube by the expansion of the porous pyrocrystalline copper (30') or condensation of the fluid conducting fluid (40) due to the temperature changes is reduced to the minimum.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for making a heat dissipating tube comprising:

preparing a copper plate;

forming a cylindrical tube with a flat bottom and an open end;

inserting a copper bar and copper powder into the cylindrical tube;

sintering the copper powder to form porous pyrocrystalline copper;

removing the copper bar and thus defining a central hole in the porous pyrocrystalline copper;

attaching a cap with a drain hole to the open end to close the open end;

filling the cylindrical tube with a heat conducting fluid through the drain hole; and drawing a vacuum inside the cylindrical tube through the drain hole and then sealing the drain hole.

2. The method as claimed in claim 1, wherein in the sintering step, a sintering temperature of approximately 1000° C. is reached.

3. The method as claimed in claim 1, wherein the cap is soldered on the open end to close the open end.

* * * * *